(12) United States Patent
Yeung et al.

(10) Patent No.: US 7,825,746 B2
(45) Date of Patent: Nov. 2, 2010

(54) INTEGRATED BALANCED-FILTERS

(75) Inventors: Lap Kun Yeung, Hong Kong (CN); Ke Li Wu, Hong Kong (CN)

(73) Assignee: The Chinese University of Hong Kong, Hong Kong (CN)

( * ) Notice: Subject to any disclaimer, the term of this patent is extended or adjusted under 35 U.S.C. 154(b) by 94 days.

(21) Appl. No.: 11/445,530

(22) Filed: Jun. 1, 2006

(65) Prior Publication Data
US 2006/0273870 A1    Dec. 7, 2006

Related U.S. Application Data

(60) Provisional application No. 60/686,977, filed on Jun. 3, 2005.

(51) Int. Cl.
H03H 7/01 (2006.01)
H01P 5/10 (2006.01)
H01P 1/203 (2006.01)

(52) U.S. Cl. .......................... 333/185; 333/25; 333/204
(58) Field of Classification Search .................. 333/25, 333/26, 175–177, 204
See application file for complete search history.

(56) References Cited

U.S. PATENT DOCUMENTS

| | | | | |
|---|---|---|---|---|
| 4,395,688 A | * | 7/1983 | Sellers | 333/169 |
| 5,164,690 A | * | 11/1992 | Yeh et al. | 333/204 |
| 5,418,507 A | * | 5/1995 | Keane et al. | 333/202 |
| 5,477,204 A | * | 12/1995 | Li | 336/200 |
| 6,529,099 B1 | * | 3/2003 | Takenaka | 333/156 |
| 6,653,910 B2 | * | 11/2003 | Escalera et al. | 333/26 |
| 6,871,059 B1 | * | 3/2005 | Piro et al. | 455/333 |
| 7,034,630 B2 | * | 4/2006 | Rijks | 333/26 |
| 7,183,872 B2 | * | 2/2007 | Lee et al. | 333/26 |
| 7,199,679 B2 | * | 4/2007 | Mondal | 333/25 |
| 7,199,682 B2 | * | 4/2007 | Ezzeddine | 333/177 |
| 7,262,674 B2 | * | 8/2007 | Kamgaing | 333/168 |
| 2004/0095212 A1 | * | 5/2004 | Iwasaki et al. | 333/204 |
| 2005/0052262 A1 | * | 3/2005 | Fukunaga et al. | 333/204 |

\* cited by examiner

*Primary Examiner*—Benny Lee
*Assistant Examiner*—Gerald Stevens
(74) *Attorney, Agent, or Firm*—Knobbe, Martens, Olson & Bear, LLP

(57) ABSTRACT

An integrated balanced-filter which acts as a matching network, a balun and an extracted-pole bandpass filter is disclosed. The balanced-filter includes an unbalanced terminal, a first balanced terminal and a second balanced terminal, a first resonator connected to the unbalanced terminal, a second resonator connected to the first balanced terminal, and a third resonator connected to the second balanced terminal. The second resonator is positively coupled to the first resonator, and the third resonator is negatively coupled to the first resonator, which provides a balun function and a bandpass-filtering function. The balanced-filter further includes extracted-pole notch filters, which can introduce a transmission zero and implement matching network. The balanced-filter can be implemented in a multi-layered substrate, thereby reducing the size of the balanced-filter.

16 Claims, 9 Drawing Sheets

300

| Components | Filter A | Filter B |
| --- | --- | --- |
| $C_S$ | 0.66 pF | 0.66 pF |
| $C_C$ | 0.27 pF | 0.27 pF |
| $C_4$ | 2.38 pF | 2.38 pF |
| $C_1$ | 2.90 pF | 2.90 pF |
| $C_2 (C_3)$ | 1.89 pF | 2.65 pF |
| $C_X$ | 7.50 pF | 1.65 pF |
| $L_4$ | 1.33 nH | 1.33 nH |
| $L_1$ | 1.34 nH | 1.34 nH |
| $L_2 (L_3)$ | 1.34 nH | 1.34 nH |
| $L_X$ | 0.94 nH | 4.27 nH |
| $M_1 (M_2)$ | 0.08 nH | 0.08 nH |

FIG. 12

INTEGRATED BALANCED-FILTERS

RELATED APPLICATIONS

This application claims the benefit of U.S. provisional patent application No. 60/686,977 filed Jun. 3, 2005 which is explicitly incorporated by reference in its entirety.

TECHNICAL FIELD OF THE INVENTION

This invention relates to an integrated balanced-filter for converting an unbalanced signal into a balanced signal or vice versa, and for bandpass-filtering the signal being converted.

BACKGROUND OF THE INVENTION

There is an ever increasing demand for fast, reliable and ad-hoc wireless data transfer between two or more terminal devices. Typical applications include mobile phones, laptop computers, cameras and printers. To satisfy such a demand, each of these devices should be equipped with a RF front-end module. In any case, miniaturization and low power consumption are the two most fundamental prerequisites for RF front-end modules.

One way to miniaturize a RF front-end module is to embed its passive circuitries, such as antenna, bandpass filter, balun, matching networks and interconnects, into a multi-layered substrate. Low Temperature Co-fired Ceramic technology (LTCC) is particularly suitable for this purpose since it can offer fine pitch lines and a multi-layered architecture for embedding passive circuits. FIG. 1 shows a block diagram for an example of such LTCC-based applications, namely, a Bluetooth system module 400. It is seen that two of the major embedded passives are the bandpass filter 410 and the balun 420.

Baluns, which converts a balanced signal to an unbalanced signal or vice versa, have been used in various RF circuitries such as those circuits interfacing with RFICs (Radio Frequency Integrated Circuits). Besides those traditionally known planar-type configurations, a number of multi-layered configurations have been proposed recently. These baluns, in general, are small and have good performance. However, they do not have specific transmission requirements over any frequency other than those within the operating frequency band. While prior art have analyzed some topologies that offer a bandpass-type of transmission response, information on how to shape up such response has never been addressed nor is the primary concern of them.

One of the fundamental representations of a balun is an ideal center-grounded transformer shown in FIG. 2. This transformer converts a single-ended input at an unbalanced terminal 510 to a differential output across a first balanced terminal 520 and a second balanced terminal 520, and vice versa, for all frequencies. In practice, however, such an ideal balun is hard to be realized due to the requirement of a high magnetic coupling.

In order to eliminate the need of two separate components for a balun and a bandpass filter in a typical integrated RF front-end module, a new device having both balun and bandpass filtering functions is provided in embodiments of the present invention.

The references cited herein are explicitly incorporated by reference in its entirety.

SUMMARY OF CERTAIN INVENTIVE ASPECTS

One aspect of the present invention provides an integrated balanced-filter for converting an unbalanced signal into a balanced signal or vice versa and for bandpass-filtering the signal being converted, which provides a small size, a good performance, and a low power consumption.

According to an embodiment of the present invention, the balanced-filter comprises a first electrical circuit and a second electrical circuit. The first electrical circuit includes an unbalanced terminal for transceiving an unbalanced signal, and a first resonator having a first node connected to the ground and a second node connected to the unbalanced terminal through a first coupling element. The first resonator includes a capacitive element and an inductive element connected in parallel to the capacitive element. The second electrical circuit includes a first balanced terminal and a second balanced terminal for transceiving a balanced signal, a second resonator having a first node connected to the ground and a second node connected to the first balanced terminal through a second coupling element, and a third resonator having a first node connected to the ground and a second node connected to the second balanced terminal through a third coupling element. Each of the second and the third resonators includes a capacitive element and an inductive element connected in parallel to the capacitive element. Moreover, the inductive element of the second resonator is positively coupled with the inductive element of the first resonator, and the inductive element of the third resonator is negatively coupled with the inductive element of the first resonator.

The first coupling element, the first resonator, the second resonator which is positively coupled with the first resonator, and the second coupling element can serve as a second-order bandpass filter, and in the meantime, the first coupling element, the first resonator, the third resonator which is negatively coupled with the first resonator, and the third coupling element can serve as another second-order bandpass filter. Therefore, the balanced-filter can provide the balun function, and simultaneously the bandpass-filtering function.

According to another embodiment of the present invention, the first electrical circuit of the above-mentioned balanced-filter may further include a fourth resonator having a first node connected to the ground and a second node connected to the first coupling element through a fourth coupling element, so that the fourth resonator is connected in parallel to the first resonator for providing an enhanced bandpass filtering characteristic. The fourth resonator also includes a capacitive element and an inductive element connected in parallel to the capacitive element.

The fourth resonator, the first resonator, the coupling elements and the second resonator, as well as the third resonator according to one embodiment of the present invention, can serve as a pair of third-order bandpass filters. Therefore, the balanced-filter of this embodiment can provide a better bandpass-filtering property.

According to another embodiment of the present invention, the second coupling element may be a first notch filter having a first node connected to the second node of the second resonator and a second node connected to the first balanced terminal so that the first notch filter is connected in series with the second resonator; and the third coupling element may be a second notch filter having a first node connected to the second node of the third resonator and a second node connected to the second balanced terminal so that the second notch filter is connected in series with the third resonator. Each of the first and the second notch filters includes a capacitive element and an inductive element connected in parallel to the capacitive element. Moreover, the notch filters are capable of matching a wide range of complex loads of the balanced-filter. Thus, the balanced-filter of this embodiment provides a matching network function, a balun function and an extracted-pole bandpass filtering function.

Moreover, in one embodiment the integrated balanced-filter may further comprise a multi-layered substrate including a plurality of dielectric layers. The components of the balanced-filter are implemented on the dielectric layers, in which the capacitive elements are realized by using parallel plates and the inductive elements are realized by using printed metal strips.

In one embodiment, the balanced-filter can provide a matching network function, a balun function and an extracted-pole bandpass filter function at the same time. Moreover, the balanced-filter can be integrated into the multi-layered substrate, thereby reducing the size of the device.

BRIEF DESCRIPTION OF THE DRAWINGS

FIG. 7b is a schematic view showing the multi-layered structure of the proposed balanced-filter as shown in FIG. 7a.

FIG. 12 is a table showing component values for the filter A and the filter B.

DETAILED DESCRIPTION OF CERTAIN INVENTIVE EMBODIMENTS

Embodiments of the present invention will be described with reference to the drawings.

Figure 1:
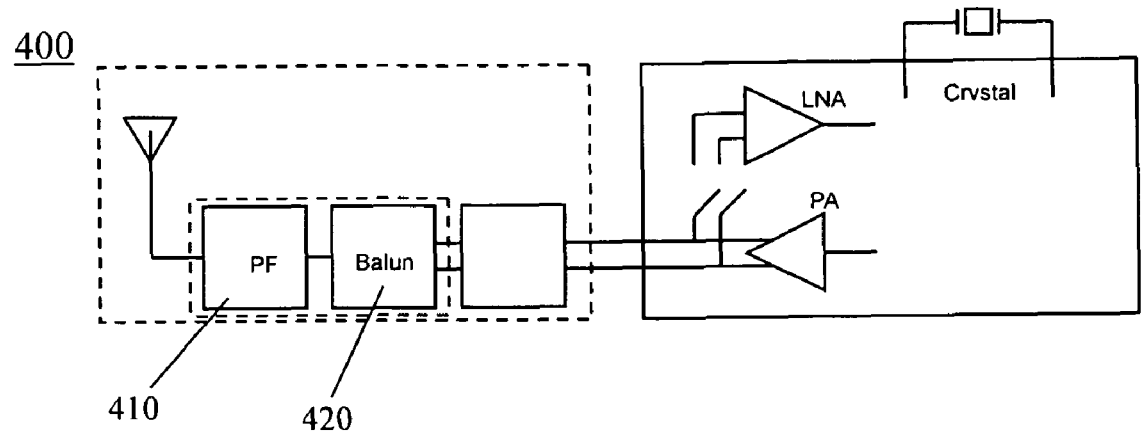
FIG. 1 is a block diagram for an LTCC Bluetooth system module in the prior art.
Figure 2:
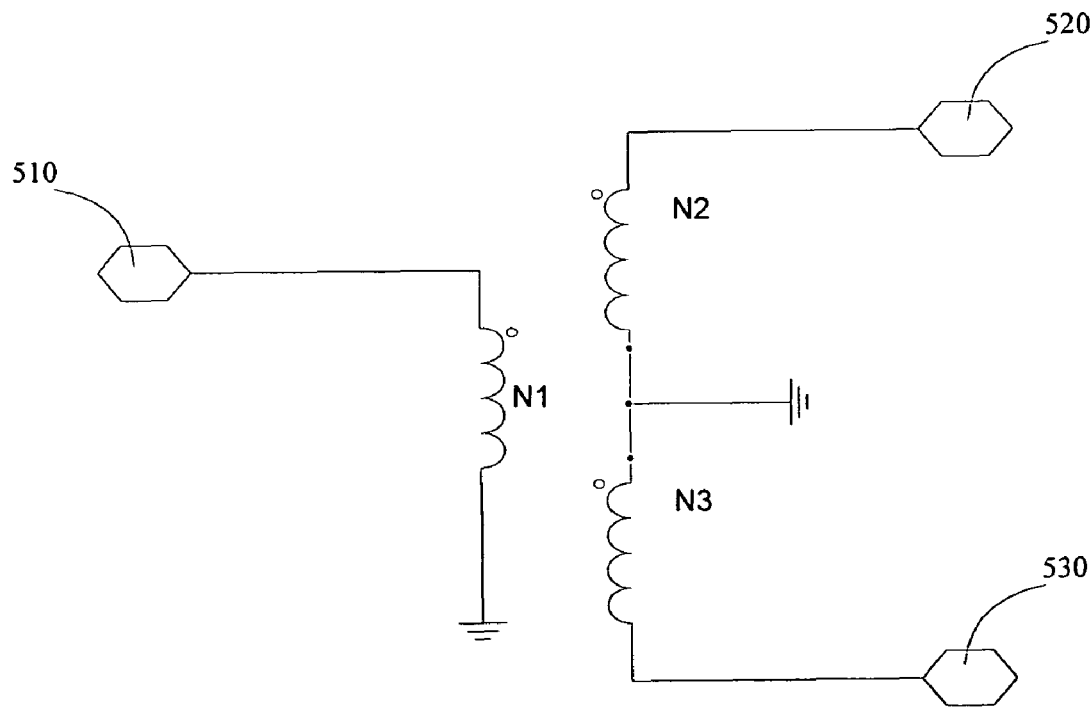
FIG. 2 is a circuit diagram illustrating the configuration of a conventional balun device.
Figure 3:
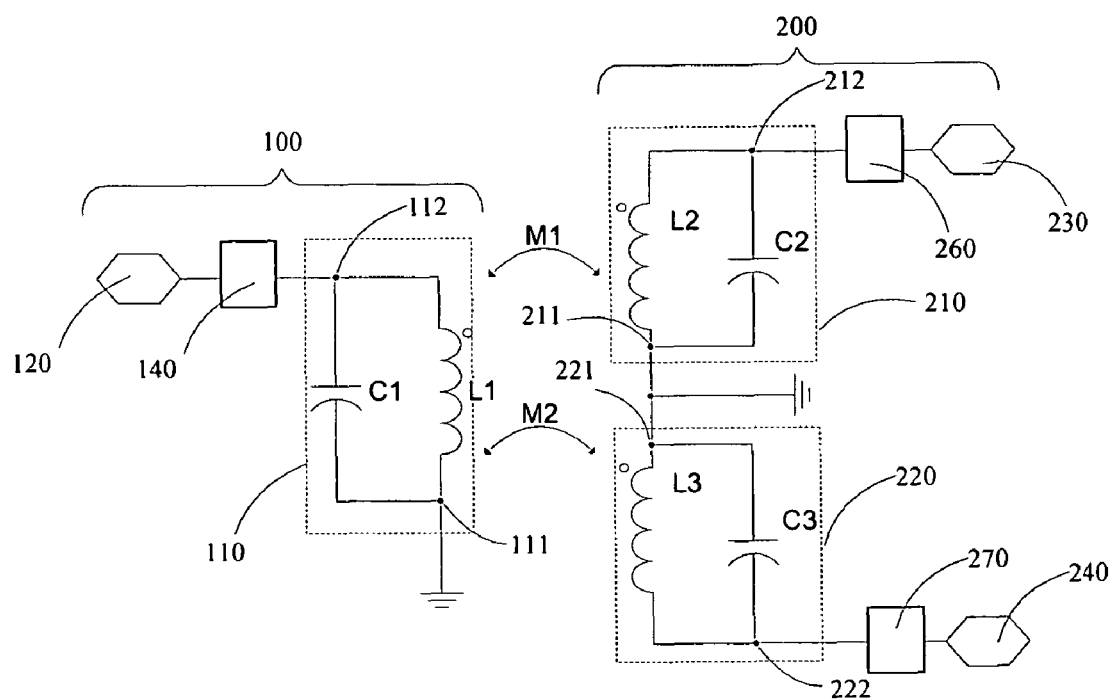
FIG. 3 is a circuit diagram illustrating the configuration of a balanced-filter according to a first embodiment of the invention.

FIG. 3 is a schematic diagram illustrating the configuration of a balanced-filter according to a first embodiment of the invention. The balanced-filter of the embodiment comprises a first electrical circuit 100 and a second electrical circuit 200. The first electrical circuit 100 includes an unbalanced terminal 120 for transceiving an unbalanced signal, and a first resonator 110 having a first node 111 connected to the ground and a second node 112 connected to the unbalanced terminal 120 through a coupling element 140. The second electrical circuit 200 includes a first balanced terminal 230 and a second balanced terminal 240 for transceiving a balanced signal, a second resonator 210 having a first node 211 connected to the ground and a second node 212 connected to the first balanced terminal 230 through a coupling element 260, and a third resonator 220 having a first node 221 connected to the ground and a second node 222 connected to the second balanced terminal 240 through a coupling element 270.

It is understood by those skilled in the art, the coupling elements 140, 260, and 270 are respectively connected between the unbalanced terminal 120 and the node 112, the first balanced terminal 230 and the node 212, the second balanced terminal 240 and the node 222 for providing a matching network function.

According to one embodiment of the present invention, the coupling element may be a capacitive element, an inductive element, or a resonator circuit including a capacitive element and an inductive element.

In the embodiment, the first resonator 110 includes a capacitive element C1 and an inductive element L1 connected in parallel to the capacitive element C1, the second resonator 210 includes a capacitive element C2 and an inductive element L2 connected in parallel to the capacitive element C2, and the third resonator 220 includes a capacitive element C3 and an inductive element L3 connected in parallel to the capacitive element C3. The inductive element L2 is positively coupled with the inductive element L1 and M1 is the mutual inductance therebetween, and the inductive element L3 is negatively coupled with the inductive element L1 and M2 is the mutual inductance therebetween, so that the inductive elements L1, L2, and L3 can serve as a balun for converting an unbalanced input signal to a balanced output signal or vice versa.

To be more explicit, the definition of the negative and positive as stated above is described as follows. As shown in FIG. 3, it is understood that a current entering the dotted terminal of the first inductive element L2 produces an open-circuit voltage between both terminals of the second inductive element L2 and another open-circuit voltage between both terminals of the third inductive element L3. Therefore, the positive coupling (positive magnetic coupling) means the voltage is sensed in the direction indicated by a positive voltage reference at the dotted terminal (i.e., the node 212) of the second inductive element L2 which is connected to the first balanced terminal, and the negative coupling (positive magnetic coupling) means the voltage is sensed in the direction indicated by a negative voltage reference at the undotted terminal (i.e. the node 222) of the third inductive element L3 which is connected to the second balanced terminal.

Moreover, the coupling element 140, the first resonator 110, the second resonator 210 which is positively coupled with the first resonator 110, and the coupling element 260 can serve as a second-order bandpass filter, and similarly, the coupling element 140, the first resonator 110, the third resonator 220 which is negatively coupled with the first resonator 110, and the coupling element 270 can serve as another second-order bandpass filter, that is, the balanced-filter of this embodiment is a second-order balanced-filter. It is understood that the configuration of the second resonator 210 is similar to that of the third resonator 220, so that the component values of the second resonator 210 are equal to those of the third resonator 220. Thus, both second-order bandpass filters have an identical center frequency and an identical bandwidth. The capacitive elements C1, C2, and C3 can be turned so as to adjust the center frequency and the bandwidth of the balanced-filter. For example, the balanced-filter of the present embodiment can have a center frequency of $\omega_c$=2.45 GHz, and a bandwidth of $B_w$=100 MHz. In this way, the integrated balanced-filter according to one embodiment of the present invention integrates a bandpass filter and a balun, which provides a good performance, save board space, decrease system cost, and simplify the design effort.

Furthermore, in order to improve the filtering property, it is possible to add one or more resonators into the balanced-filter so as to form a pair of multi-order bandpass filters.

Figure 4:
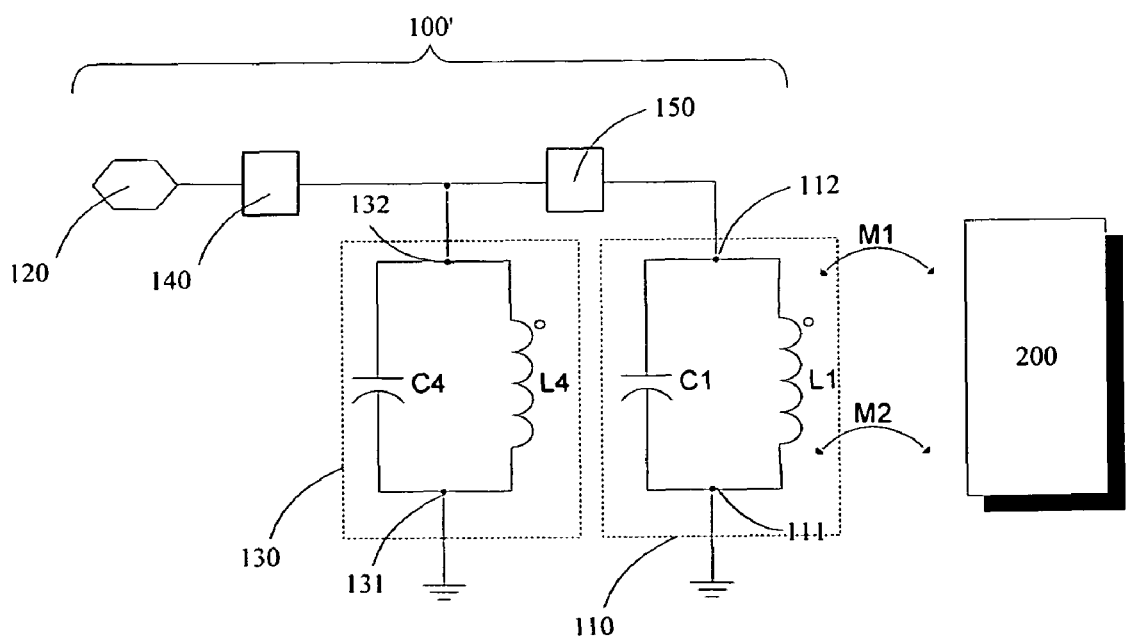
FIG. 4 is a circuit diagram illustrating the configuration of a balanced-filter according to a second embodiment of the invention.

According to a second embodiment of the present invention, a fourth resonator can be added in the above balanced-filter. As shown in FIG. 4, the balanced-filter of the present embodiment comprises the second electrical circuit 200 as described above, and a first electrical circuit 100'. Compared with the first electrical circuit 100 of the first embodiment, the first electrical circuit 100' further includes a fourth resonator 130 connected in parallel to the first resonator 110. The fourth resonator 130, which includes a capacitive element C4 and an inductive element L4 connected in parallel to the capacitive element C4, has a first node 131 connected to the ground and a second node 132 connected to the coupling element 140. In the present embodiment, a fourth coupling element 150 is provided between the node 112 and the node 132. Therefore, the first coupling element 140, the fourth resonator 130, the coupling element 150, the first resonator 110, the second resonator 210 which is positively coupled with the first resonator 110, and the coupling element 260 can serve as a third-order bandpass filter, and similarly, the first coupling element 140, the fourth resonator 130, the coupling element 150, the first resonator 110, the third resonator 220 which is negatively coupled with the first resonator 110, and the coupling element 260 can serve as another third-order bandpass filter, that is, the balanced-filter of this embodiment is a third-order balanced-filter.

According to one embodiment of the present invention, the first and the second coupling elements 140 and 150 may be capacitors CS and CC, respectively.

Moreover, in a typical ISM (Industrial, Scientific, and Medical) band application, a strong rejection is always required at a certain frequency, for example, a rejected frequency of $\omega_0$=1.9 GHz, so that a notch filter can be used at each balanced terminal of the balanced-filter to produce a transmission zero at the rejected frequency. This is known as an extracted-pole technique.

Figure 5:
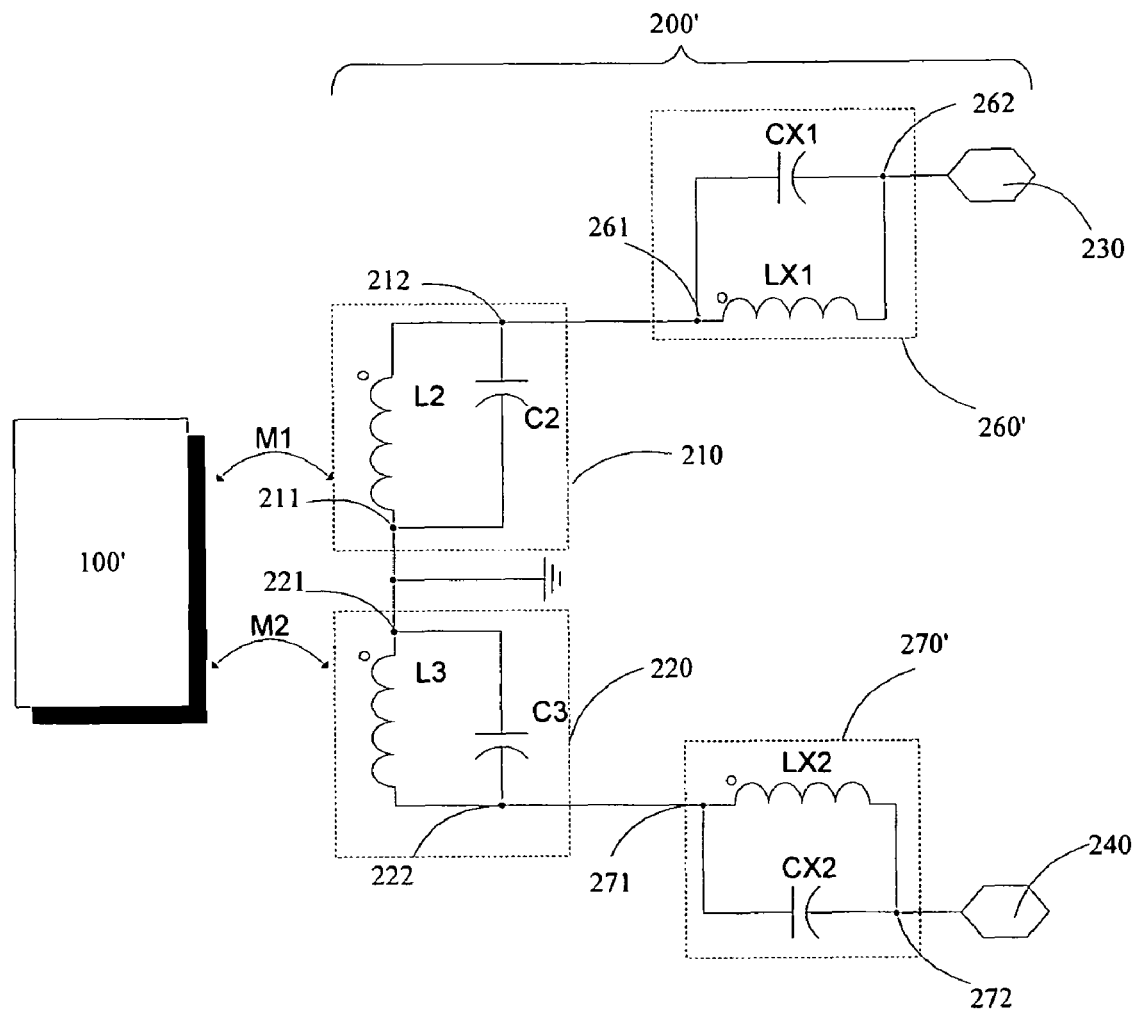
FIG. 5 is a circuit diagram illustrating the configuration of a balanced-filter according to a third embodiment of the invention.

According to a third embodiment of the invention, the balanced-filter may further comprise a notch filter for notch-filtering the balanced signals at a rejected frequency. As shown in FIG. 5, the balanced-filter of the present embodiment comprises the first electrical circuit 100' as described above, and a second electrical circuit 200'. In the second electrical circuit 200', the coupling elements 260 and 270 are replaced by a first notch filter 260' and a second notch filter 270'. The first notch filter 260', which includes a fifth capacitive element CX1 and a fifth inductive element LX1 connected in parallel to the fifth capacitive element CX1, has a first node 261 connected to the second node 212 of the second resonator 210, and a second node 262 connected to the first balanced terminal 230. Similarly, the second notch filter 270', which includes a sixth capacitive element CX2 and a sixth inductive element LX2 connected in parallel to the sixth capacitive element CX2, has a first node 271 connected to the second node 222 of the second resonator 220, and a second node 272 connected to the first balanced terminal 240. Since the notch filter 260' is connected in series with the second resonator 210, and the notch filter 270' is connected in series with the second resonator 220, the balanced-filter according to the present embodiment can further provide a notch-filtering function. It is understood that the configuration of the first notch filter 260' is similar to that of the second notch filter 270', so that the component values of the first notch filter 260' are equal to those of the second notch filter 270'. Moreover, the component values of the notch filters 260' and 270' are depended on an impedance of each output node, the rejected frequency $\omega_0$, filter bandwidth and the bandpass center frequency $\omega_c$.

In one embodiment, the notch filter can also serve as a coupling element for providing a matching network function between the balanced-filter and a load. The principle and the mathematical demonstration thereof will be described in detail latter.

Moreover, it is understood by those skilled in the art that the number of the notch filters is not limited to two, but depended on the number of the transmission zero required. For example, if two rejected frequencies of $\omega_{0-1}$ and $\omega_{0-2}$ are needed in the system, then two notch filters should be serially connected between the node 212 and the balanced terminal 230 and the other two notch filters should be serially connected between the node 222 and the balanced terminal 240.

Design of the Balanced-Filter

According to one embodiment of the present invention, a conventional coupled-resonator theory can be used to design the integrated balanced-filter having a balun function and a bandpass filtering function as shown in FIGS. 3 and 4. For example, a method for designing the balanced-filter of the second embodiment as shown in FIG. 4, which provides the balun function and the third-order bandpass filtering function, comprises the following steps:

1. Calculating prototype component values of a third-order bandpass filter using the table given in reference [8] (G L. Matthaei, L. Young, and E. M. T. Jones, Microwave Filters, Impedance Matching Networks and Coupling Structures, New York: McGraw-Hill, 1980), in which an inductive-type impedance inverter can be used between the first and the second resonators, as well as between the first and the third resonators;

2. Converting the series inductive elements between the first, the second and the third resonators to a mutual inductance by the method described in reference [9] (L. K. Yeung and K. L. Wu, "A compact second-order LTCC bandpass filter with two finite transmission zeros," IEEE Trans. Microwave Theory Tech., vol. 51, pp. 337-341, February 2003);

3. Adding a negatively coupled tank with same component values and mutual inductance as those of the positively coupled tank in step 2; and 4. Reducing the mutual inductance by a factor of 42.

Moreover, the component values of the notch filters as shown in FIG. 5 can be achieved by the following method. As stated above, the component values of the first notch filter are equal to those of the second notch filter, that is, CX1=CX2=CX, LX1=LX2=LX. Firstly, assuming each output node has a load impedance of $Z_L=R_L+jX_L$, a transmission zero appears at frequency $\omega_0$ and the bandpass center frequency is $\omega_c$, then the equivalent input admittance looking out from the positively coupled second resonator or negatively coupled third resonator towards each corresponding load is $$Y_{eq} = G_{eq} + jB_{eq} = \frac{R_L}{R_L^2 + X^2} - j\frac{X}{R_L^2 + X^2} \qquad (3)$$

where, $$X = X_L - \left(\omega_c \cdot C_X - \frac{1}{\omega_c \cdot L_X}\right)^{-1}. \quad (4)$$

Secondly, by equating $G_{eq}$ to the required $J_{n,n+1}{}^2/G_B$, the component values are obtained as $$L_X = \frac{1 - (\omega_c/\omega_0)^2}{\omega_c} \cdot \left(\pm \sqrt{\frac{G_B \cdot R_L}{J_{n,n+1}^2} - R_L^2} - X_L\right) \quad (5)$$

where $J_{n,n+1}$ is an impedance inverter whose value depends solely on the order of filter, required filter reflection coefficient in the pass band and the filter fractional bandwidth, n is the order of the filter, $G_B$ is the desired terminating conductance of a prototype filter characteristics and $$C_X = \frac{1}{\omega_0^2 \cdot L_X}. \quad (6)$$

The sign of the square-root in (5) should be chosen in a way that LX is a positive value. Finally, the residual shunted susceptance $B_{eq}$ should be "absorbed" by its adjacent resonator.

As stated above, the notch filter is capable of matching a wide range of complex loads. This feature can be studied by letting $r_L = G_B R_L$ and $x_L = G_B X_L$, where $G_B$ is the desired terminating conductance of a prototype filter characteristics and rewriting (5) as a family of circle equation $$\left(r_L - \frac{G_B^2}{2J_{n,n+1}^2}\right)^2 + \left[x_L + \frac{G_B \omega_c L_x}{1 - (\omega_c/\omega_0)^2}\right]^2 = \left(\frac{G_B^2}{2J_{n,n+1}^2}\right)^2 \quad (7)$$

with radius a and center $(r_c, x_c)$ as $$\left. \begin{array}{l} a = \dfrac{G_B^2}{2J_{n,n+1}^2} \\[6pt] r_c = \dfrac{G_B^2}{2J_{n,n+1}^2} \text{ and } x_c = \dfrac{G_B \omega_c L_x}{1 - (\omega_c/\omega_0)^2} \end{array} \right\} \quad (8)$$

Figure 10:
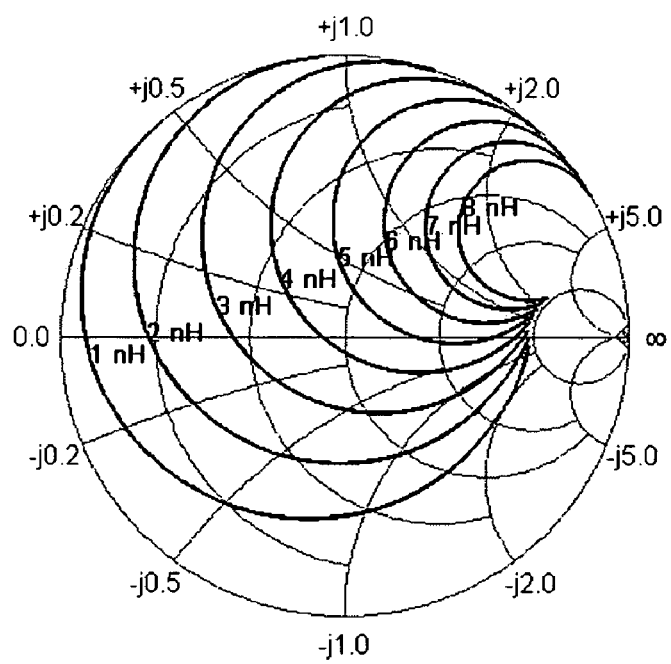
FIG. 10 is a schematic view showing the complex load matching range.

This equation suggests that given a fixed value of LX, any complex load lies on a circle defined by (7) will be matched. Consequently, by considering those commonly implemented inductor values using LTCC technology, a range (a set of circles) of "matchable" complex loads can be determined. An example is shown in FIG. 10. This set of curves are generated for a filter with 0.2 dB bandpass ripple, center frequency of 2.45 GHz, bandwidth of 250 MHz and transmission zero at 1.9 GHz. Notice that the values of the inductive element LX1 (LX2) are between 1 nH and 8 nH.

Figure 11:
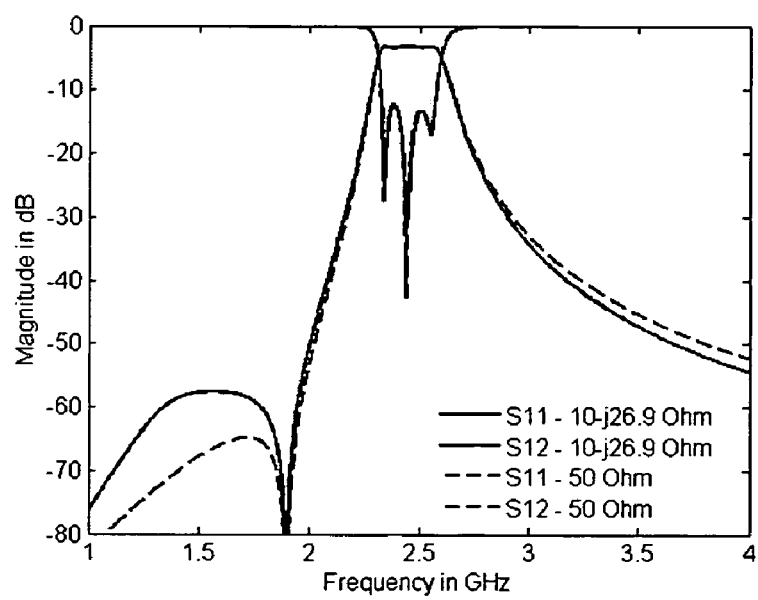
FIG. 11 is a schematic view showing frequency responses of a filter A with 10-j26.9 Ohm load (solid line) and a filter B with 50-Ohm load (dashed line).

The region spanned by the set of curves covers a large portion of the Smith Chart, which means that a wide range of complex loads can be matched by using the parallel tanks with inductor values between 1-nH to 8-nH. For example, when the load impedance is 10-j26.9 Ohm, an inductance of value 0.94-nH is required. For comparison purpose, frequency responses of a 10-j26.9 Ohm terminated filter A and a standard 50-Ohm terminated filter B, both are designed to have −15 dB return loss in the pass band, are shown in FIG. 11. The corresponding component values for these two filters are shown in FIG. 12. It is understood by those skilled in the art that when the load is changed due to the requirement, the component values of the notch filters can be adjusted to implement the matching function between the balanced-filter and the load.

Physical Implementation

According to one embodiment of the present invention, the inductive elements can be implemented by conventional inductors and the capacitive elements can be implemented by conventional capacitors.

Figure 6:
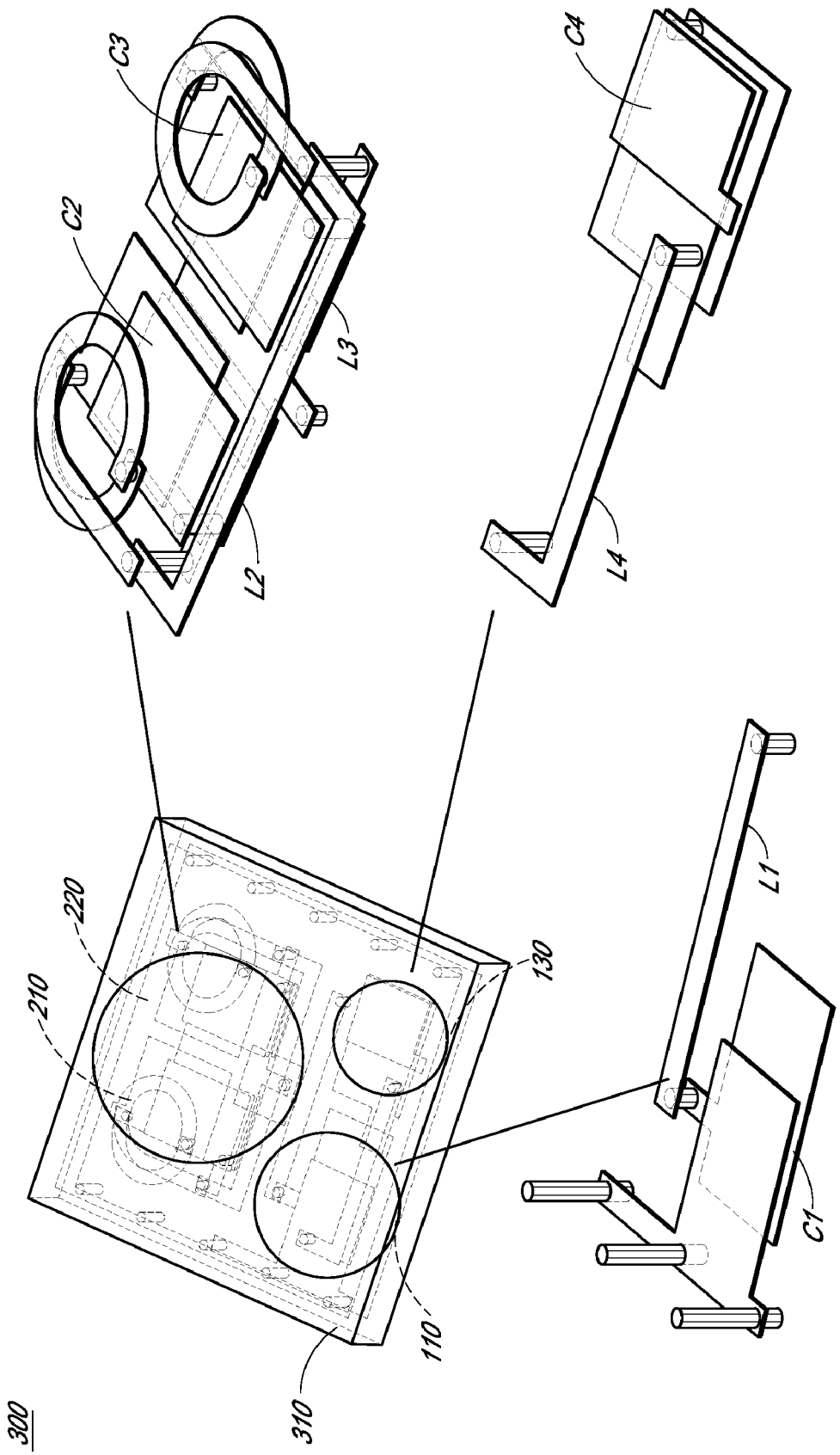
FIG. 6 is a top view of a physical layout of the proposed balanced-filter, in which a first, a second, a third and a fourth resonators are shown with enlarged views.
Figure 7A:
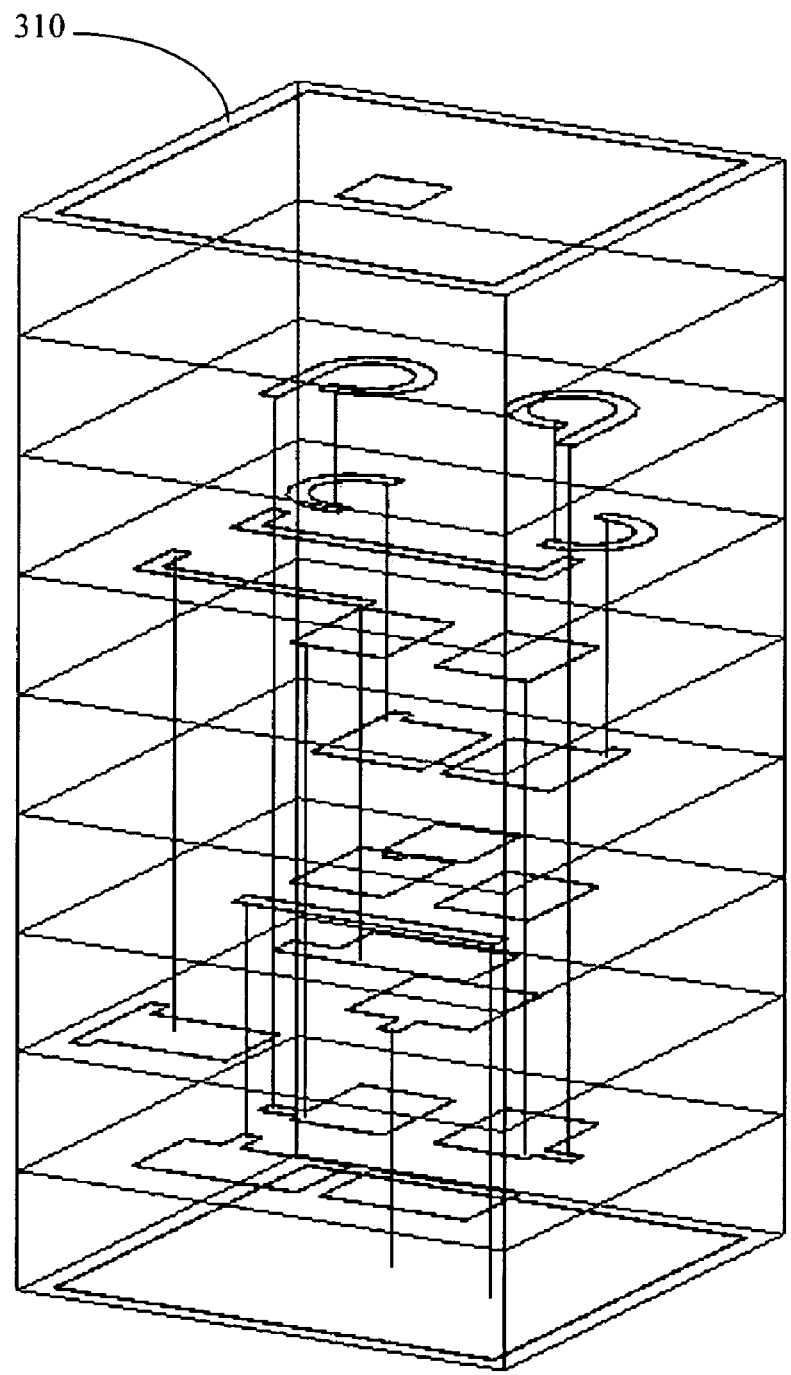
FIG. 7a is a perspective view of the physical layout of the proposed balanced-filter.
Figure 7B:
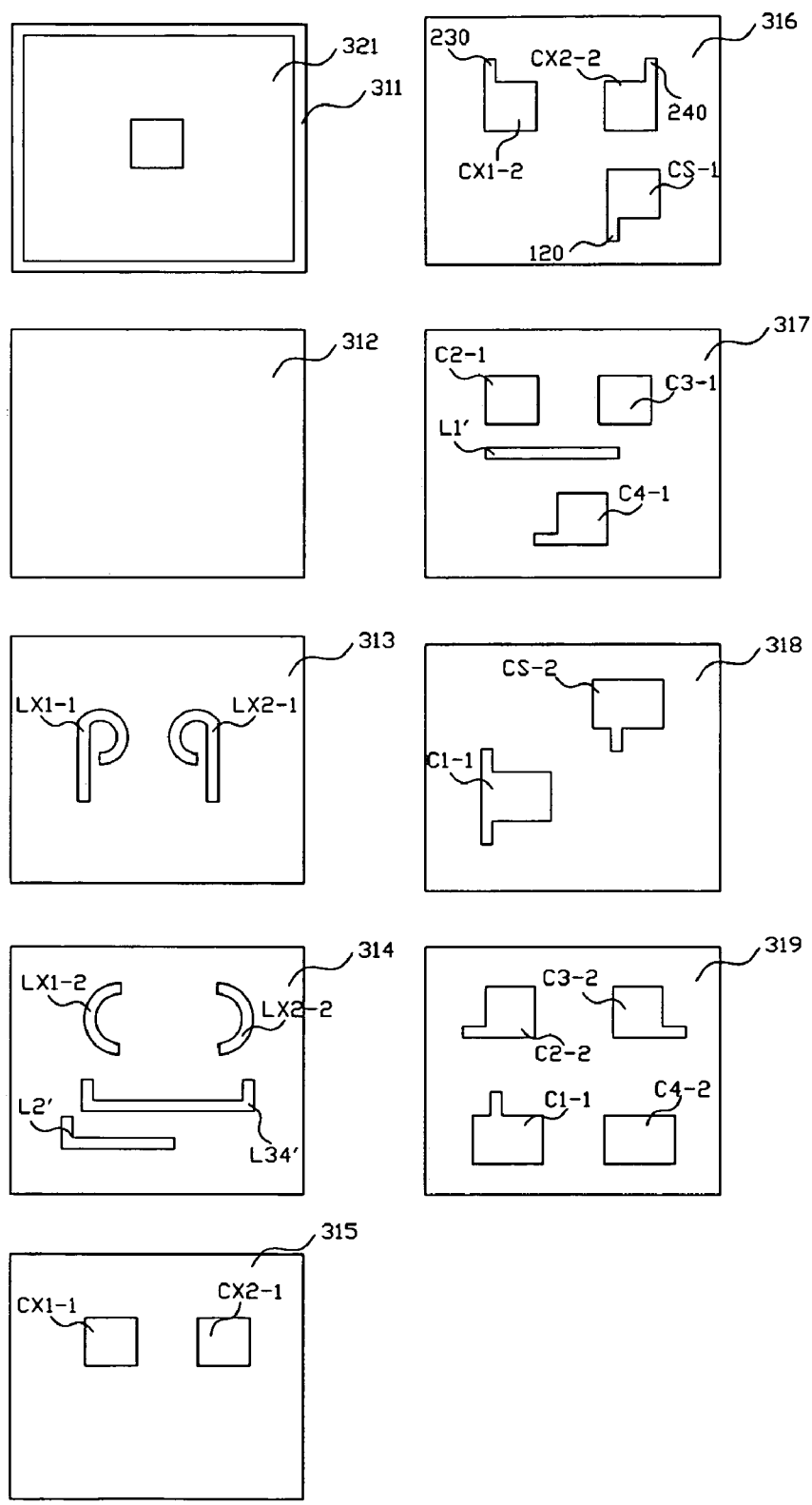

In order to miniaturize the balanced-filter according to one embodiment of the present invention, the balanced-filter is realized by using a multi-layered substrate. Low Temperature Co-fired Ceramic technology (LTCC) is particularly suitable for this purpose since it can offer fine pitch lines and a multi-layered architecture for embedding passive circuits. FIG. 6 shows a physical layout of the proposed balanced-filter. As shown in FIG. 6, the balanced-filter 300 comprises a multi-layer substrate 310 that is a layered structure including stacked dielectric layers. FIG. 7a is a perspective view of the physical layout of a proposed third order balanced-filter, and FIG. 7b is a schematic view of the balanced-filter showing the multi-layered structure of the proposed balanced-filter as shown in FIG. 7a. Referring to FIGS. 7a and 7b, the multi-layer substrate 310 comprises nine dielectric layers 311-319 which are stacked together. Each of the nine layers 311-319 is about 3.6 mil in thickness, and approximately 166-mil by 188-mil in size. It is understood by those skilled in the art, the capacitive elements can be realized by using parallel plates, the inductive elements can be realized by using printed metal strips. The circuit elements are implemented on the bottom seven layers with the first two layers mainly for inductive elements, and the other five layers for capacitive elements.

FIG. 7b illustrates an example of a configuration of layers of the multi-layer substrate 310 making up the balanced-filter of the embodiment. On the top surface of the dielectric layer 311, a ground plane 321 is provided for isolating the balanced-filter from other embedded components. The dielectric layer 313 is provided with printed metal strips LX1-1 and LX2-1 and the dielectric layer 314 is provided with printed metal strips LX 1-2 and LX2-2, which makes up the inductive elements LX1 and LX2, respectively. The dielectric layer 314 also provides a pair of closely spaced strips L2' and L34' for implementing the inductive elements L2, L3 and L4, respectively. The inductive elements L1 is realized by using printed metal strip L1' disposed on the layer 317. The conductor plates CX1-1 and CX2-1 provided on the dielectric layer 315 and the conductor plates CX1-2 and CX2-2 provided on the dielectric layer 316 make up the capacitive elements CX1 and CX2, respectively. Similarly, the conductor plates C1-1, C1-2, C2-1, C2-2, C3-1, C3-2, C4-1, C4-2, CS-1, CS-2 make up the capacitive elements C1, C2, C3, C4, CS, respectively. Moreover, the connection between these components can be realized by using through holes (not shown).

Figure 8:
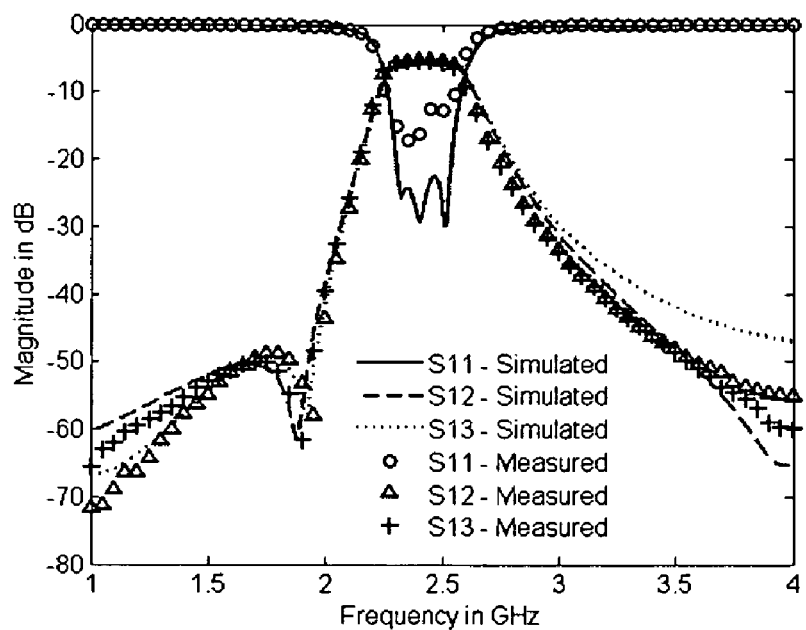
FIG. 8 shows simulated and measured transmission and reflection responses of the proposed balanced-filter.
Figure 9:
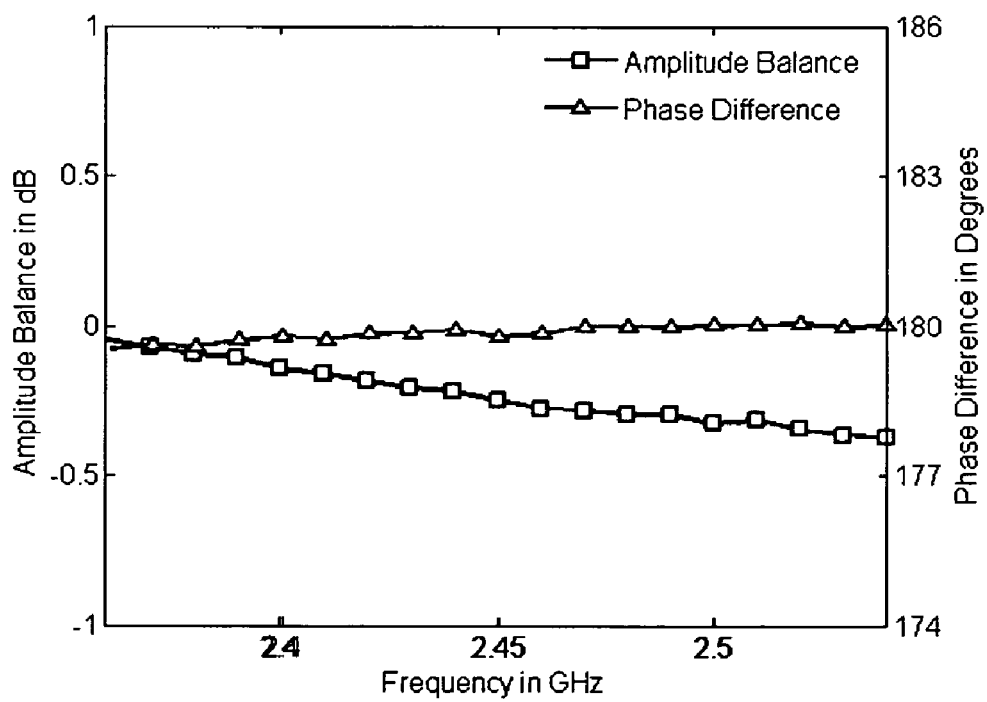
FIG. 9 shows a measured amplitude balance and phase difference of the proposed balanced-filter.

An experimental prototype has been built using an LTCC substrate with a dielectric constant of about 7, and measurements were carried out through its three external terminals 120, 230, and 240 locating at the top of the substrate. Collected scattering parameter data was then calibrated to desired reference planes through the thru-reflect-line (TRL) calibration technique, and the results together with those from a full-wave electromagnetic simulation are presented in FIG. 8. The corresponding experimental amplitude balance and phase difference between the two balanced terminals 230 and 240 are shown in FIG. 9.

A few comments about the experimental results are worth mentioning. Firstly, a deep rejection occurs, as expected, at the desired frequency of 1.9-GHz in the transmission response. Secondly, a very good amplitude balance of approximately 0.3-dB difference between signals at the two balanced terminals is obtained. And finally, the maximum 1° of phase in-balance is achieved within the bandpass.

As stated above, at least one embodiment of the present invention provides a multi-layered integrated balanced-filter, which acts as a matching network, balun and an extracted-pole bandpass filter at the same time. It is shown through an experimental prototype that the balun-filter exhibits a good amplitude balance as well as a good phase balance within the operating frequency band of interest. In addition, a desired bandpass response with third-order Chebyshev-type characteristics is achieved. To further satisfy the rejection requirement, an extracted-pole technique is employed to sharpen the out-of-band rejection. The extracted-pole notch filters also play the role of absorbing complex load. Therefore, the device also incorporates the function of a matching network. In general, this balun-filter can serve as a good candidate for a compact RF front-end module or a standalone RF functional component.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

The invention claimed is:

1. An integrated balanced-filter, comprising:
   a first electrical circuit, including:
      an unbalanced terminal for transceiving an unbalanced signal,
         a first resonator having a first node connected to a ground and a second node, and
         a fourth resonator having a first node connected to the ground and a second node, the second node of the fourth resonator is connected to the unbalanced terminal through a first coupling element and connected to the second node of the first resonator through a fourth coupling element; and
      a second electrical circuit, including:
         first and second balanced terminals for transceiving a balanced signal,
         a second resonator having a first node connected to the ground and a second node connected to the first balanced terminal through a second coupling element, and
         a third resonator having a first node connected to the ground and a second node connected to the second balanced terminal through a third coupling element, and
      the second resonator being positively coupled with the first resonator, and the third resonator being negatively coupled with the first resonator, and
      each of the resonators includes a respective capacitive element and a respective inductive element connected in parallel to the corresponding capacitive element,
      wherein the second coupling element includes a first notch filter at the first balanced terminal and being serially connected between the second resonator and the first balanced terminal; and
      the third coupling element includes a second notch filter at the second balanced terminal and being serially connected between the third resonator and the second balanced terminal,
      the first coupling element, the first resonator, the fourth coupling element, the fourth resonator, the second resonator, and the second coupling element form a first third-order bandpass filter; and the first coupling element, the first resonator, the fourth coupling element, the fourth resonator, the third resonator, and the third coupling element form a second third-order bandpass filter.

2. An integrated balanced-filter, comprising:
   a first electrical circuit, including:
      an unbalanced terminal for transceiving an unbalanced signal, and
      a first resonator having a first node connected to a ground and a second node connected to the unbalanced terminal through a first coupling element; and
   a second electrical circuit, including:
      first and a second balanced terminals for transceiving a balanced signal,
      a second resonator having a first node connected to the ground and a second node connected to the first balanced terminal through a second coupling element, and
      a third resonator having a first node connected to the ground and a second node connected to the second balanced terminal through a third coupling element, and
   the second resonator being positively coupled with the first resonator, and the third resonator being negatively coupled with the first resonator, and
   each of the resonators includes a capacitive element and an inductive element connected in parallel to the capacitive element,
   wherein the second coupling element includes a first notch filter at the first balanced terminal and being serially connected between the second resonator and the first balanced terminal; and
   the third coupling element includes a second notch filter at the second balanced terminal and being serially connected between the third resonator and the second balanced terminal,
   wherein the first coupling element, the first resonator, the second resonator, and the second coupling element form a first second-order bandpass filter; and the first coupling element, the first resonator, the third resonator, and the third coupling element form a second second-order bandpass filter.

3. The integrated balanced-filter of claim 2, wherein the inductive element of the second resonator is positively coupled with the inductive element of the first resonator, and the inductive element of the third resonator is negatively coupled with the inductive element of the first resonator.

4. The integrated balanced-filter of claim 2, wherein the first electrical circuit further includes a fourth resonator having a first node connected to the ground and a second node connected to the second node of the first resonator through a fourth coupling element so that the fourth resonator is connected in parallel to the first resonator for improving the bandpass filtering characteristic.

5. The integrated balanced-filter of claim 4, wherein the fourth resonator includes a capacitive element and an inductive element connected in parallel to the capacitive element of the fourth resonator.

6. The integrated balanced-filter of claim 5, wherein the first coupling element, the first resonator, the fourth coupling element, the fourth resonator, the second resonator, and the second coupling element form a first third-order bandpass filter; and the first coupling element, the first resonator, the fourth coupling element, the fourth resonator, the third resonator, and the third coupling element form a second third-order bandpass filter.

7. The integrated balanced-filter of claim 4, wherein each of the first and the fourth coupling elements is one chosen from a capacitive element, an inductive element, and a resonator circuit.

8. The integrated balanced-filter of claim 2, wherein each of the first and second notch filters includes a respective capacitive element and a respective inductive element connected in parallel to the corresponding capacitive element.

9. The integrated balanced-filter of claim 8, wherein for a complex load of $Z_L=R_L+jX_L$, the value $C_x$ of the capacitive element and the value $L_X$ of the inductive element of each of the first and second notch filters are designed by $$L_X = \frac{1-(\omega_c/\omega_0)^2}{\omega_c} \cdot \left( \pm \sqrt{\frac{G_B \cdot R_L}{J_{n,n+1}^2} - R_L^2} - X_L \right) \text{ and } C_X = \frac{1}{\omega_0^2 \cdot L_X}$$

where $\omega_0$ is a rejected frequency of the first and second notch filters, $\omega_c$ is the bandpass center frequency, $J_{n,n+1}$ is an impedance inverter, n is the order of the integrated balanced-filter, $G_B$ is the desired terminating conductance of a prototype filter characteristics, $R_L$ is the real component of the load impedance, and $X_L$ is the imaginary component of the load impedance.

10. The integrated balanced-filter of claim 9, wherein the first and second notch filters are capable of matching the complex load of $Z_L=R_L+jX_L$, which satisfies the following equation $$\left( r_L - \frac{G_B^2}{2J_{n,n+1}^2} \right)^2 + \left[ x_L + \frac{G_B \omega_c L_x}{1-(\omega_c/\omega_0)^2} \right]^2 = \left( \frac{G_B^2}{2J_{n,n+1}^2} \right)^2$$

where $r_L=G_B R_L$ and $x_L=G_B X_L$.

11. The integrated balanced-filter of claim 2, wherein the first electrical circuit further includes
one or more additional resonators, each of which is connected between the ground and the first coupling element so that each of the one or more additional resonators is connected in parallel to the first resonator for improving the bandpass filtering characteristic.

12. The integrated balanced-filter of claim 2, wherein the balanced-filter further comprises a multi-layered substrate including a plurality of dielectric layers, and the first and second electrical circuits of the balanced-filter are implemented on the dielectric layers, in which the respective capacitive elements are realized by using parallel plates and the respective inductive elements are realized by using printed metal strips.

13. The integrated balanced-filter of claim 12, wherein the multi-layered substrate is a multi-layered LTCC substrate.

14. An integrated balanced-filter, comprising:
a multi-layered substrate including a plurality of dielectric layers and a ground plane stacked on a layer of the dielectric layers,
a balanced-filter on the substrate, comprising:
an unbalanced terminal for transceiving an unbalanced signal;
first and a second balanced terminals for transceiving a balanced signal;
a first resonator having a first node connected to the ground plane and a second node connected to the unbalanced terminal through a first coupling element;
a second resonator having a first node connected to the ground plane and a second node connected to the first balanced terminal through a second coupling element; and
a third resonator having a first node connected to the ground plane and a second node connected to the second balanced terminal through a third coupling element, and
the second resonator being positively coupled with the first resonator and the third resonator being negatively coupled with the first resonator,
wherein the second coupling element includes a first notch filter at the first balanced terminal and being serially connected between the second resonator and the first balanced terminal; and
the third coupling element includes a second notch filter at the second balanced terminal and being serially connected between the third resonator and the second balanced terminal,
wherein the first coupling element, the first resonator, the second resonator, and the second coupling element form a first second-order bandpass filter; and the first coupling element, the first resonator, the third resonator, and the third coupling element form a second second-order bandpass filter.

15. The integrated balanced-filter of claim 14, wherein the balanced-filter further includes
a fourth resonator having a first node connected to the ground plane and a second node connected to the first coupling element so that the fourth resonator is connected in parallel to the first resonator for improving the bandpass filtering characteristic.

16. The integrated balanced-filter of claim 14, wherein each of the first and second notch filters includes a respective capacitive element and a respective inductive element connected in parallel to the corresponding capacitive element.

* * * * *